United States Patent
Ma et al.

(10) Patent No.: US 12,259,664 B2
(45) Date of Patent: Mar. 25, 2025

(54) METHOD OF DESIGNING AN ALIGNMENT MARK

(71) Applicant: ASML NETHERLANDS B.V., Veldhoven (NL)

(72) Inventors: Jigang Ma, Veldhoven (NL); Hua Li, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 408 days.

(21) Appl. No.: 17/640,899

(22) PCT Filed: Aug. 17, 2020

(86) PCT No.: PCT/EP2020/073007
§ 371 (c)(1),
(2) Date: Mar. 7, 2022

(87) PCT Pub. No.: WO2021/052695
PCT Pub. Date: Mar. 25, 2021

(65) Prior Publication Data
US 2022/0334505 A1    Oct. 20, 2022

(30) Foreign Application Priority Data

Sep. 19, 2019  (EP) .................................... 19198332
Oct. 23, 2019  (EP) .................................... 19204856

(51) Int. Cl.
*H01L 23/544* (2006.01)
*G03F 9/00* (2006.01)

(52) U.S. Cl.
CPC ............ *G03F 9/708* (2013.01); *G03F 9/7084* (2013.01); *H01L 23/544* (2013.01)

(58) Field of Classification Search
CPC ................................ G03F 9/708; H01L 23/544
See application file for complete search history.

(56) References Cited

U.S. PATENT DOCUMENTS 7,598,024 B2    10/2009  Lalbahadoersing et al.
2001/0019880 A1    9/2001  Ebertseder et al.
(Continued)

FOREIGN PATENT DOCUMENTS

CN    101034263    9/2007
CN    101446768    6/2009
(Continued)

OTHER PUBLICATIONS

Office Action issued in corresponding Chinese Patent Application No. 202080065572.1, dated Dec. 6, 2023.
(Continued)

*Primary Examiner* — Peter Bradford
(74) *Attorney, Agent, or Firm* — Pillsbury Winthrop Shaw Pittman, LLP (57) ABSTRACT

A method of configuring a mark having a trench to be etched into a substrate, the method including: obtaining a relation between an extent of height variation across a surface of a probationary layer deposited on a probationary trench of a probationary depth and a thickness of the probationary layer; determining an extent of height variation across the surface of a layer deposited on the mark allowing a metrology system to determine a position of the mark; and configuring the mark by determining a depth of the trench based on the relation, the extent of height variation and the thickness of a process layer to be deposited on the mark.

21 Claims, 4 Drawing Sheets

(56) References Cited

U.S. PATENT DOCUMENTS

2007/0212652 A1* 9/2007 Lalbahadoersing .. H01L 23/544
430/311
2012/0032356 A1   2/2012 Reymann et al.
2018/0374741 A1  12/2018 Tutuc et al.

FOREIGN PATENT DOCUMENTS

| CN | 102012637         | 4/2011  |         |           |
|----|-------------------|---------|---------|-----------|
| DE | 102019217313 A1 * | 5/2021  | ........ | E01D 22/00 |
| EP | 3819431 B1 *      | 2/2023  | ........ | E01D 22/00 |
| KR | 20050066894 A *   | 6/2005  |         |           |

OTHER PUBLICATIONS

International Search Report and Written Opinion issued in corresponding PCT Patent Application No. PCT/EP2020/073007, dated Nov. 27, 2020.

* cited by examiner

METHOD OF DESIGNING AN ALIGNMENT MARK

CROSS-REFERENCE TO RELATED APPLICATIONS

This application is the U.S. national phase entry of PCT Patent Application No. PCT/EP2020/073007 which was filed on Aug. 17, 2020, which claims the benefit of priority of European Patent Application No. 19198332.9 which was filed on Sep. 19, 2019 and of European Patent Application No. 19204856.9 which was filed on Oct. 23, 2019 which are incorporated herein in their entireties by reference.

FIELD OF THE INVENTION

The present invention relates to a lithographic apparatus and a method for manufacturing a device.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Manufacturing processes of semiconductor structures or other structures on a substrate, commonly involve plural lithographic steps and other processing steps, whereby a pattern is applied on the substrate, followed by steps such as selective etching, growing of a layer, ion implantation, diffusion, etc. The plural patterns are to be aligned in respect of each other, for which alignment marks may be provided on the substrate. The alignment marks may be formed by patterns, such as trenches, and may interact with an alignment beam of an alignment measurement system of a lithographic apparatus.

When manufacturing for example high voltage or high power electronic devices, a relatively thick process layer may be applied on the substrate. Ion implantation may be applied in the process layer in order to provide a desired amount of charge carriers in the layer. Such relatively thick process layers may be grown step by step, whereby a thinner layer is applied and ion implantation carried out, which process steps may be repeated until a desired thickness of the process layer is achieved.

Alignment marks may be required on the process layer. In view of the thickness of the process layer, alignment marks covered by the process layer may however disappear. Therefore, additional process steps may be required in between the repeated steps of growing the thinner layer and the ion implantation, to be able to transfer the original mark to the top of the thus obtained process layer.

SUMMARY OF THE INVENTION

It is desirable to enable to reduce a number of process steps required to transfer an alignment mark to a top of a relatively thick layer on a substrate.

According to an aspect of the invention, there is provided a method of designing an alignment mark on a substrate, the alignment mark comprising at least one trench etched into the substrate, the method comprising:

obtaining a relation between
    an extent of height variation across a surface of a probationary layer deposited on a probationary mark having a probationary mark trench of a probationary depth, and
    a thickness of the probationary layer;
wherein the probationary mark is representative of the alignment mark and wherein the probationary layer is representative of a process layer deposited on the alignment mark,
    determining a desired extent of height variation across the surface of the probationary layer deposited on the probationary mark, the height variation at the desired extent to enable to determine by an alignment system, from the height variation across the surface of the probationary layer on the probationary mark, a position of the probationary mark; and
    configuring the alignment mark by determining a desired depth of the at least one trench of the alignment mark using the relation, the desired extent of height variation and a pre-defined thickness of the process layer deposited on the alignment mark.

According to another aspect of the invention, there is provided an alignment mark designed according to the method of the invention.

According to yet another aspect of the invention, there is provided a method of aligning a substrate in a lithographic process, the method comprising:
    providing a substrate comprising an alignment mark in accordance with the invention, and
    providing a process layer having a pre-defined thickness on the substrate, and
    performing an alignment measurement on a height variation of the process layer across the alignment mark.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
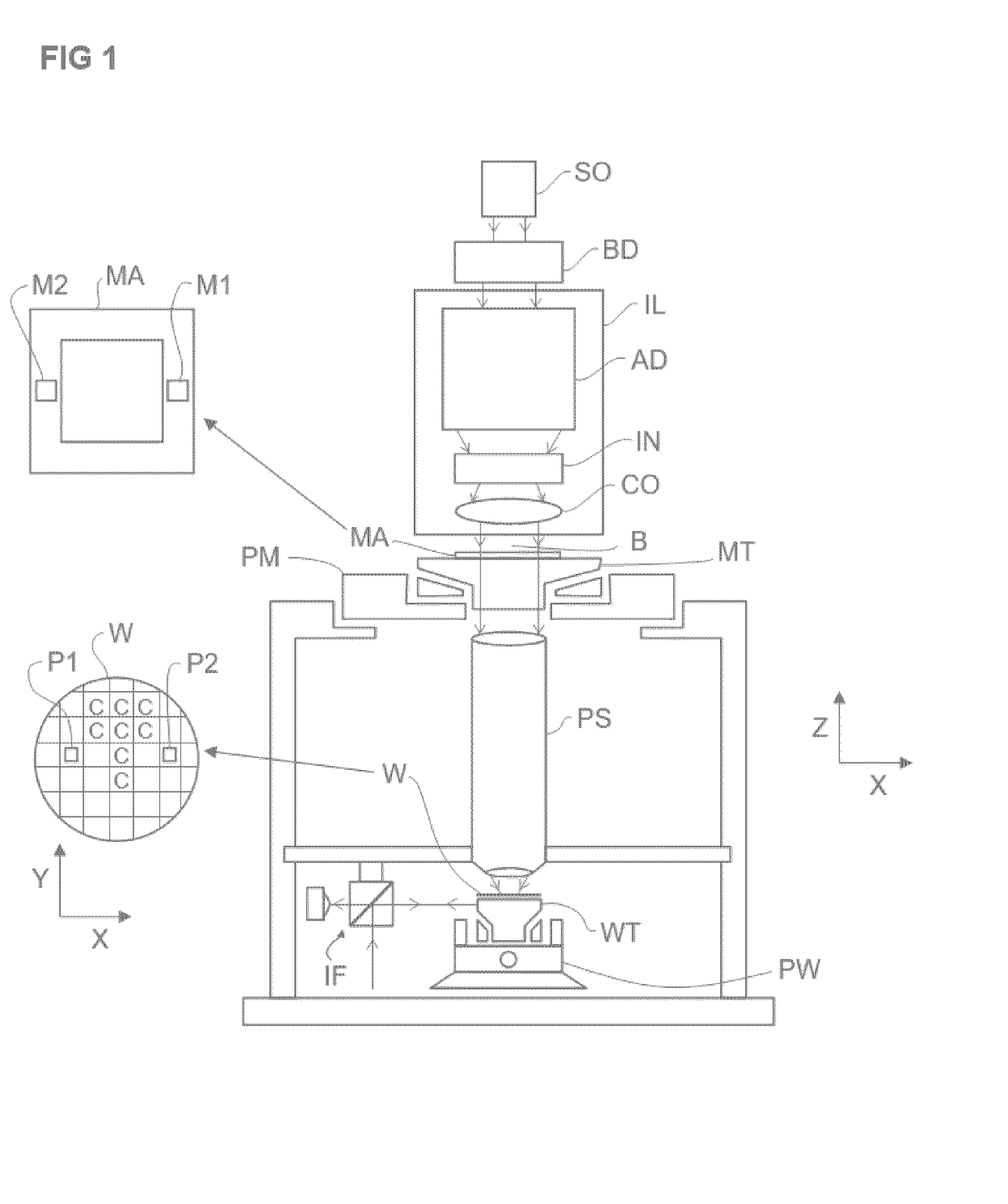
FIG. 1 depicts a lithographic apparatus in which an embodiment of the invention may be employed.

FIG. 1 schematically depicts a lithographic apparatus according to one embodiment of the invention. The apparatus comprises an illumination system IL, a support structure MT, a substrate table WT and a projection system PS.

The illumination system IL is configured to condition a radiation beam B. The support structure MT (e.g. a mask table) is constructed to support a patterning device MA (e.g. a mask) and connected to a first positioner PM configured to accurately position the patterning device in accordance with certain parameters. The substrate table WT (e.g. a wafer table) is constructed to hold a substrate W (e.g. a resist-coated wafer) W and connected to a second positioner PW configured to accurately position the substrate in accordance with certain parameters. The projection system PS is configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The term "radiation beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam B in different directions. The tilted mirrors impart a pattern in a radiation beam B which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables WT (and/or two or more mask tables). In such "multiple stage" machines the additional tables may be used in parallel, or preparatory steps may be carried out on one or more tables while one or more other tables are being used for exposure. In addition to one or more substrate tables WT, the lithographic apparatus may have a measurement stage that is arranged to be at a position beneath the projection system PS when the substrate table WT is away from that position. Instead of supporting a substrate W, the measurement stage may be provided with sensors to measure properties of the lithographic apparatus. For example, the projection system may project an image on a sensor on the measurement stage to determine an image quality.

The lithographic apparatus may also be of a type wherein at least a portion of the substrate W may be covered by a liquid having a relatively high refractive index, e.g. water, so as to fill a space between the projection system and the substrate. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illumination system IL receives a radiation beam B from a radiation source SO. The radiation source SO and the lithographic apparatus may be separate entities, for example when the radiation source SO is an excimer laser. In such cases, the source is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illuminator IL, together with the beam delivery system BD if required, may be referred to as a radiation system.

The illumination system IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illumination system can be adjusted. In addition, the illumination system IL may comprise various other components, such as an integrator IN and a condenser CO. The illumination system IL may be used to condition the radiation beam B, to have a desired uniformity and intensity distribution in its cross-section.

The radiation beam B is incident on the patterning device MT, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module and a short-stroke module, which form part of the first positioner PM. The long-stroke module may provide coarse positioning of the short-stroke module over a large range of movement. The short-stroke module may provide fine positioning of the support structure MT relative to the long-stroke module over a small range of movement. Similarly, movement of the substrate table WT may be realized using a long-stroke module and a short-stroke module, which form part of the second positioner PW. The long-stroke module may provide coarse positioning of the short-stroke module over a large range of movement. The short-stroke module may provide fine positioning of the substrate table WT relative to the long-stroke module over a small range of movement. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the mask alignment marks M1, M2 may be located between the dies.

The depicted apparatus could be used in at least one of the following modes:

In a first mode, the so-called step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In a second mode, the so-called scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In a third mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
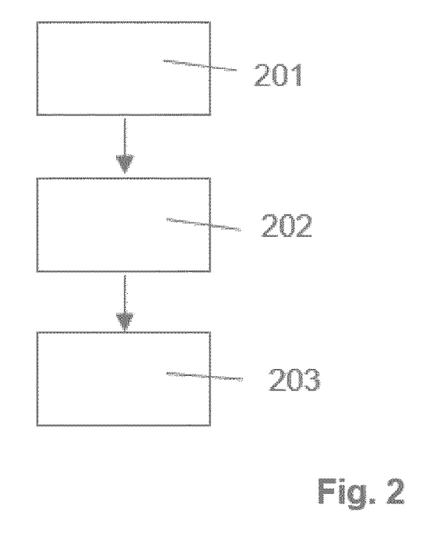
FIG. 2 depicts a flow diagram illustrating a method of designing a mark according to an embodiment of the invention.

FIG. 2 depicts a flow diagram illustrating a method of designing an alignment mark on a substrate. The alignment mark comprises at least one trench etched into the substrate.

In step 201, a relation is obtained between
  an extent of height variation across a surface of a probationary layer deposited on a probationary mark having a probationary mark trench of a probationary depth, and
  a thickness of the probationary layer.

A probationary mark etched in a probationary substrate is used as a starting point. A probationary layer is deposited on the probationary mark. The probationary substrate, layer and mark may be physical or simulated in a process simulation. The probationary mark is representative of the alignment mark and the probationary layer is representative of a process layer deposited on the alignment mark. The relation may be determined experimentally or from simulation, as described in more detail with reference to FIGS. 3A, 3B and 4 below.

In step 202, a desired extent of height variation across the surface of the probationary layer deposited on the probationary mark is determined. The height variation at the desired extent enables to determine by an alignment system, from the height variation across the surface of the probationary layer on the probationary mark, a position of the probationary mark. The height variation at the desired extent may be understood as an extent of height variation as required by the alignment system to be able to detect a position of the underlying alignment mark from the height variation, i.e. from the relief, in the probationary layer. The desired extent of height variation may thus be understood as a characteristic of the alignment system. The desired extent of height variation may be determined by a probationary alignment system, such as a physical alignment system interacting with a physical probationary layer on a physical probationary mark, or a simulated alignment system interacting with a simulated probationary layer on a simulated probationary mark. The probationary alignment system may be representative of the alignment system as applied to determine the position of the alignment mark from the height variation of the process layer across the alignment mark.

In step 203, the alignment mark is configured, i.e. designed, by determining a desired depth of the at least one trench of the alignment mark using:
- the relation,
- the desired extent of height variation, and
- a pre-defined thickness of the process layer deposited on the alignment mark.

The alignment mark may be understood as a structure in or on a surface of a substrate, enabling to detect a position by an alignment measurement system. The alignment mark may comprise one or plural trenches, e.g. elongate trenches formed in the top surface of the substrate. The alignment mark may for example by a primary mark. A process layer may be understood as a layer, such as a semiconductor material layer, provided on the substrate, e.g. provided on the top surface of the substrate. The process layer may for example be an epitaxial layer, a laminate or (thinner) layers such as epitaxial layers, or any other suitable layer, such as a layer of crystal impurity atom such as Silicon, Germanium, and may contain compounds such as gallium nitride (GaN), gallium arsenide (GaAs). The layer may be formed by a crystalline material such as an epitaxial layer of different materials. In another embodiment, the layer may be formed by a dielectric material such as an oxide, a nitride, or others deposited by using chemical vapor deposition or by other means. The height variation may be understood as a relief in the top surface of the probationary layer respectively the process layer.

The probationary mark may be a trial version, experimental version or precursor version of the mark. The probationary mark may have a similar dimensioning as the alignment mark, or may be dimensioned differently, e.g. having less trench depth. The probationary mark may be a physical mark or a simulated mark in a simulated design environment.

Similarly, the probationary layer may be a trial version, experimental version or precursor version of the process layer. The probationary layer may have a similar dimensioning as the probationary layer, or may be dimensioned differently, e.g. having less thickness. The probationary layer may be a physical layer or a simulated layer in a simulated design environment.

The height variation may be understood as a spatial variation of a height of the surface of the probationary layer respectively the process layer. The height variation may be understood as a relief. The extent of height variation may hence be understood as a height difference of the relief.

Figure 3A:
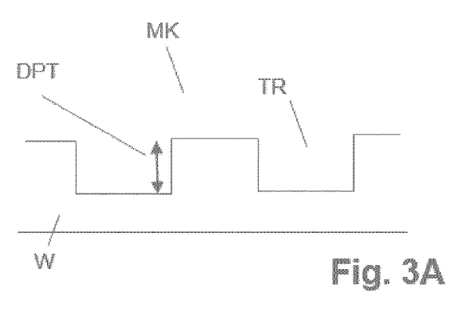
FIGS. 3A and 3B depict a probationary mark respectively a probationary mark with a probationary layer.
Figure 3B:
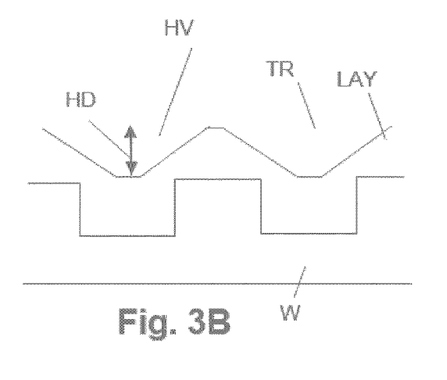

FIG. 3A depicts a probationary mark profile, e.g. cross sectional view, of a probationary mark MK provided on a probationary substrate W. The probationary mark is formed by trenches TR etched into a top surface of the probationary substrate W. A depth of the trenches in indicted by DPT. FIG. 3B depicts a probationary layer LAY provided on the probationary substrate W, and in particular across the probationary mark MK. When providing the layer on the probationary mark, a height difference HD, i.e. an extent of height variation HV results in a top surface of the probationary layer, the height variation resulting from the trench TR in the top surface. In order to obtain a relation between the thickness of the probationary layer on the probationary mark and the extent of height variation across the surface of the probationary layer, the height difference in the top surface of the probationary layer may be determined in response to at least two different probationary layer thicknesses on the probationary substrate. The relation may be determined from the change in height variation of the top surface of the probationary layer as a function of the change in thickness of the probationary layer. For example, a (probationary) first epitaxial layer is provided on the probationary substrate and a height variation on the surface of the first epitaxial layer covering the probationary mark is determined. Then, a (probationary) second epitaxial layer is provided on the (probationary) first epitaxial layer, and the height variation on the surface of the (probationary) second epitaxial layer covering the probationary mark and the (probationary) first epitaxial layer is determined. The height variations as a function of the thickness of the probationary layer may be determined from experimentation and/or from simulation, e.g. using a process model.

Figure 4:
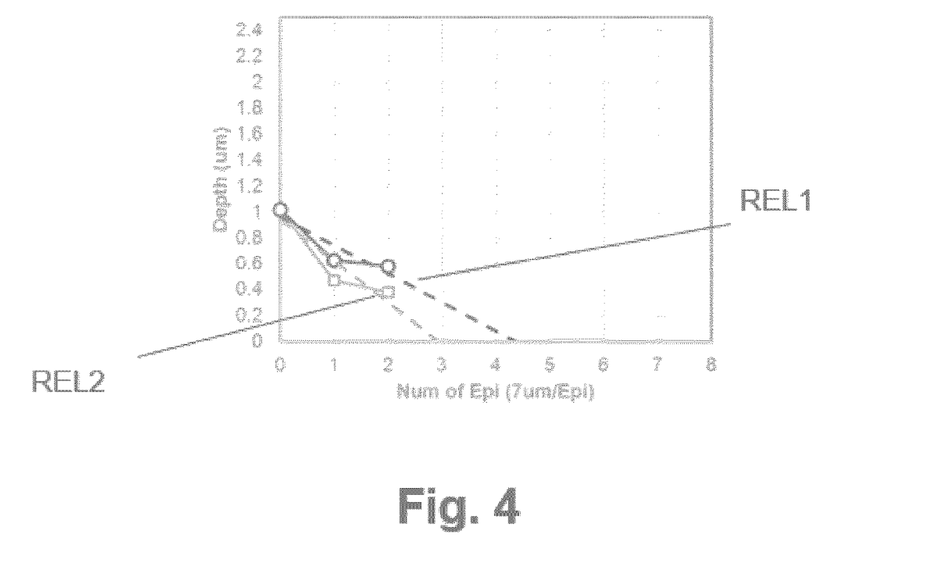
FIG. 4 depicts a relation between depth of the height variation across the surface of the probationary layer and the thickness of the probationary layer.

FIG. 4 depicts a graphical view of probationary mark depth versus layer thickness, in the present example expressed in number of (e.g. epitaxial) layers on the probationary substrate. In the present example, the depth of the probationary mark trench is 1 micrometer. After application of a (probationary) first epitaxial layer, a resulting height difference of the height variation on the surface of the (probationary) first epitaxial layer is entered in the graph, and the same is repeated after application of a (probationary) second epitaxial layer on the (probationary) first epitaxial layer. Hence, multiple data points are obtained and a relation between resulting height variation and thickness of the probationary layer may be derived therefrom. The relation may for example be obtained by curve fitting to the obtained data points, e.g. fitting a linear approximation to the obtained data points, such as REL1 in FIG. 4. As another example, a polynomial curve may be applied. As the relation may differ at different parts of the surface of the substrate, the resulting depths and the relation may be determined at different parts of the surface of the substrate. Correspondingly, a second curve is determined from a second set of data points, as indicated by REL2. For example, the second curve may relate to a (probationary) mark at a lower trench depth.

In the present example, the relations in determined as a straight line, i.e. a linear relation, which may provide a low overall error to match the data points. The linear approximation may for example provide a degree of averaging, thus being tolerant to some degree to data points that appear to deviate, e.g. irregular data points, hence providing a relatively robust relation. Alternatively, a curve, such as a polynomial curve may be applied, e.g. using a curve fitting algorithm, to fit the curve to the data points using a fitting criterion, such as a minimization of an error function. For example, a second order or third order curve may be fitted to the data points. Thereby, a more accurate relation may be defined.

The relation may be derived from increments, e.g. from a change in height variation of the probationary layer as a result of a change in thickness of the probationary layer. For example, in accordance with the example schematically depicted in FIG. 4, the relation may express a decrease in height variation of the probationary layer as a result of an increase in thickness of the probationary layer.

In order to enable the alignment system (i.e. alignment measurement system) to determine a position of the mark from the height variation of the layer across the mark, a desired extent of height variation across the surface of the probationary layer deposited on the probationary mark is determined. The desired extent of height variation enables the alignment system to determine the position of the mark at a desired accuracy. The desired extent of height variation may be determined by experimentation and/or simulation. For example, the desired extent of height variation may be between 300 and 500 nanometers in case of an alignment measurement beam in a visible or near infrared wavelength range.

Figure 5:
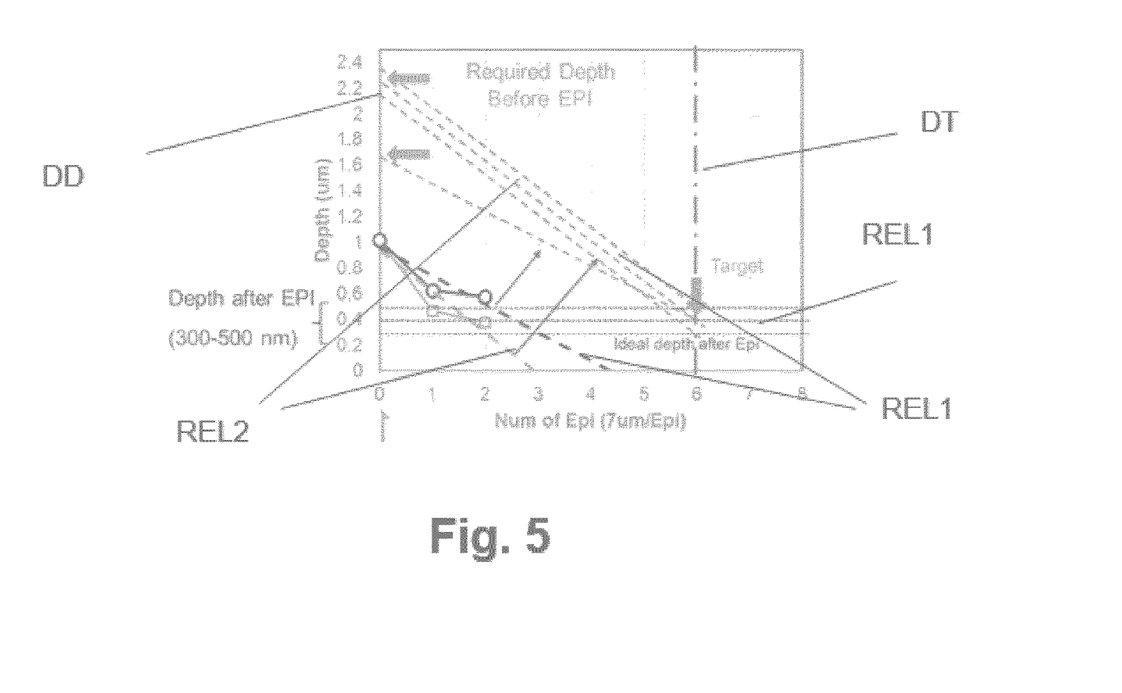
FIG. 5 depicts a graphical representation illustrating determining a desired depth of the at least one trench of the alignment mark using the relation, the desired extent of height variation and a pre-defined thickness of the process layer deposited on the alignment mark.

FIG. 5 depicts a graphical view of probationary mark depth versus layer thickness, in the present example expressed in number of (e.g. epitaxial) layers on the probationary substrate. The determined curves REL1 and REL2, as depicted in FIG. 4, are likewise depicted in FIG. 5. As will explained with reference to FIG. 5, the alignment mark is designed by determining a desired depth of the at least one trench of the alignment mark using:
the relation,
the desired extent of height variation, and
a pre-defined thickness of the process layer deposited on the alignment mark.

Thereto, the desired depth is depicted in the curve, i.e. in the present example between 300 nm and 500 nm. Starting from a pre-defined (e.g. desired) thickness DT of the process layer, e.g. in the present example 42 micrometers, i.e. 6 epitaxial layers of 7 nanometers each. Starting from the pre-defined thickness of the process layer and using the relation between resulting height variation and thickness of the probationary layer, the required depth of the alignment mark may be determined, using the relation e.g. as in the present example by extrapolation using the determined (linear) relation. As depicted in FIG. 5, a steepest ones of the relations, i.e. relation REL2, is applied, so as to take into account a "worst case" degradation of the alignment mark when applying the layer onto the substrate. Thus, based on the desired depth of 300-500 nanometers, the slope of REL2, and the desired thickness of the layer of 6 times 7 micrometers epitaxial layer, a mark trench depth, i.e. desired depth DD, of approximately 2.2-2.4 micrometers would be desired.

In case the of extrapolation using the determined relation, the probationary mark and probationary layers may make use of a different layer thickness, e.g. a more common, more readily available or known layer thickness, Thus, the deriving the relation from the probationary mark and probationary layers may be simplified.

The alignment mark may be designed using the determined mark trench depth.

Figure 6A:
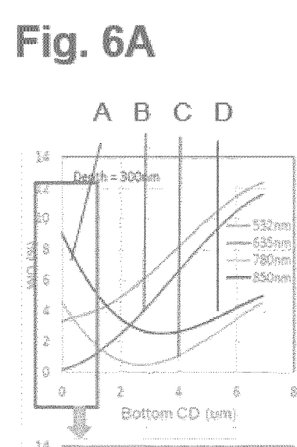
FIGS. 6A-6F depict graphs to illustrate a measurement of an alignment beam as a function of bottom critical dimension of the alignment mark, at different alignment beam wavelengths.
Figures 6B, 6C:
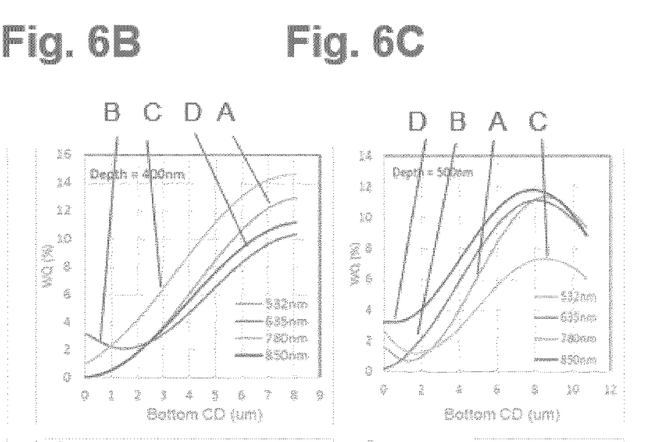
Figure 6D:
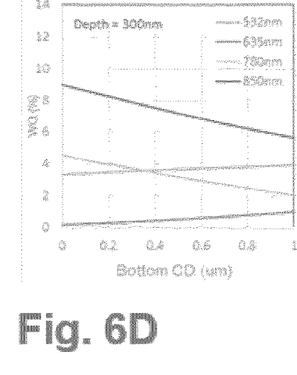
Figures 6E, 6F:
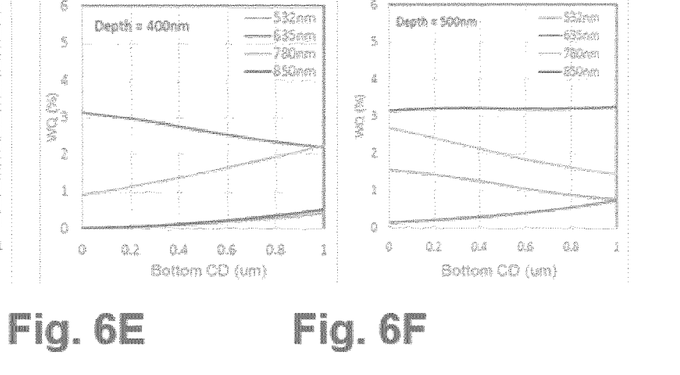

A bottom critical dimension of the mark may further be determined, as described with reference to FIGS. 6A-6F. FIGS. 6A-6C depict a simulation of alignment sensor signal strength, WQ, versus Bottom Critical Dimension, CD, at respective resulting mark depths, i.e. at resulting un-flatness in the process layer, of 300, 400 and 500 nanometers, respectively. FIGS. 6D-6F depict respective enlarged views of the simulations of FIGS. 6A-6C, for a bottom critical dimension between 0 and 1 micrometer. In the present example, the simulations are performed for different wavelengths, e.g. 532 nm (A), 635 nm (B), 780 nm (C), and 850 nm (D).

The wavelength of the alignment beam may be selected based on height variation and subsequently CD is selected to optimize alignment sensor signal strength (WQ). The wavelength of the alignment beam may be selected for the bottom CD variation 0-1 um. The optimization criteria is using alignment signal strength e.g. 1%.

Figures 7A, 7B:
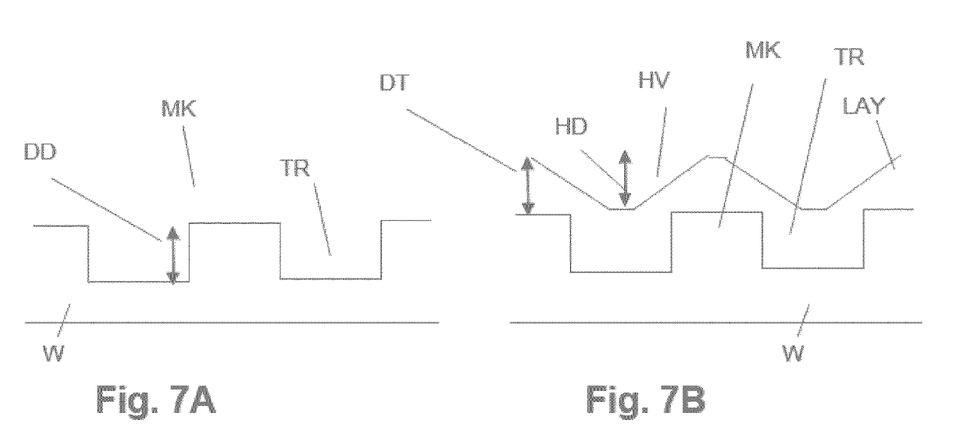
FIGS. 7A and 7B depict an alignment mark respectively an alignment mark provided with a process layer, the alignment mark designed according to the described method.

FIG. 7A depicts an illustrative, cross sectional view of an alignment mark MK in a substrate W designed by the disclosed method. The alignment mark MK may be embodied as a physical alignment mark or a design, e.g. a data file comprising design parameters enabling to reproduce the alignment mark designed by the described method. The alignment mark comprises a trench TR having the desired depth DD as determined by the method.

Accordingly, as depicted in FIG. 7B, when a process layer LAY having the pre-defined thickness DT is applied across the mark MK in substrate W, a height variation HV with a height difference of HD is provided in a top surface of the process layer, which height variation enables to determine the position of the mark MK (in particular in the horizontal plane substantially perpendicular to the surface of the substrate) by an alignment measurement system. Thus, the alignment measurement system, instead of interacting with the trench TR of the mark MK, may thereby interact with the height variation that results in the top surface of the layer as a result of the underlying alignment mark designed according to the presently disclosed method.

In addition to the use of the method to design/configure alignment marks also any other marks comprising at least a trench etched into a substrate may be configured according to the methods as disclosed in this document. For example a bottom grating (mark) comprised within an overlay mark (e.g. a mark extending across two layers deposited on the substrate) may be configured according to any method as described in this document. Instead of the alignment system a metrology system (like a scatterometer) may then be used to determine the position of the bottom grating (with respect to the top grating (mark) comprised within the overlay mark).

In an embodiment a method of configuring a mark comprising a trench etched into a substrate is provided, the method comprising: a) obtaining a relation between an extent of height variation across a surface of a probationary layer deposited on a probationary trench of a probationary depth and the thickness of the probationary layer; b) determining an extent of height variation across the surface of a layer deposited on the mark allowing a metrology system to determine a position of the mark; and c) configuring the mark by determining a depth of the trench based on the relation, the extent of height variation and the thickness of the layer.

In an embodiment the mark is (part of) an alignment mark or an overlay mark.

Further embodiments of the invention are disclosed in the list of numbered clauses below:
1. A method of designing an alignment mark on a substrate, the alignment mark comprising at least one trench etched into the substrate, the method comprising:
   a) obtaining a relation between an extent of height variation across a surface of a probationary layer deposited on a probationary mark having a probationary mark trench of a probationary depth, and a thickness of the probationary layer, wherein the probationary mark is representative of the alignment mark and wherein the probationary layer is representative of a process layer deposited on the alignment mark;
   b) determining a desired extent of height variation across the surface of the probationary layer deposited on the probationary mark, the height variation at the desired extent to enable to determine by an alignment system, from the height variation across the surface of the probationary layer on the probationary mark, a position of the probationary mark; and
   c) configuring the alignment mark by determining a desired depth of the at least one trench of the alignment mark using the relation, the desired extent of height variation and a pre-defined thickness of the process layer deposited on the alignment mark.

2. The method according to clause 1, wherein the relation is determined from at least two different thicknesses of the probationary layer and at least two respective extents of height variation across the surface of the probationary layer deposited on the probationary mark in response to the at least two different thicknesses of the probationary layer.

3. The method according to clause 2, wherein the determining the relation comprises fitting a curve using the at least two different determined height variations in response to the at least two different thicknesses of the probationary layer.

4. The method according to clause 3, wherein the curve is a linear curve.

5. The method according to clause 3 or 4, wherein the pre-defined thickness of the process layer exceeds the at least two thicknesses of the probationary layer, the desired depth being determined using an extrapolation of the curve.

6. The method according to any of clauses 2-7, wherein the at least two respective extents of height variation across the surface of the probationary layer deposited on the probationary mark are determined using a process model.

7. The method according to any of the preceding clauses, wherein the desired extent of height variation across the surface of the probationary layer deposited on the probationary mark is determined using a simulation of the alignment system interacting with the height variation across the surface of the probationary layer.

8. The method according to clause 7, wherein the simulation is performed for plural bottom critical dimensions of the probationary mark trench, the method further comprising selecting the bottom critical dimension of the probationary mark using an outcome of the simulation.

9. An alignment mark designed according to the method of any of the preceding clauses.

10. A method of aligning a substrate in a lithographic process, the method comprising:
   providing a substrate comprising an alignment mark in accordance with clause 10, and
   providing a process layer having a pre-defined thickness on the substrate, and
   performing an alignment measurement on a height variation of the process layer across the alignment mark.

11. A computer program containing one or more sequences of machine-readable instructions describing a method according to any of the preceding clauses.

12. A data storage medium having the computer program of clause 11 stored therein.

13. A computer system configured to execute the computer program of clause 11.

14. A method of configuring a mark comprising a trench etched into a substrate, the method comprising:
   a) obtaining a relation between an extent of height variation across a surface of a probationary layer deposited on a probationary trench of a probationary depth and the thickness of the probationary layer;
   b) determining an extent of height variation across the surface of a layer deposited on the mark allowing a metrology system to determine a position of the mark; and c) configuring the mark by determining a depth of the trench based on the relation, the extent of height variation and the thickness of the layer.

15. The method according to clause 14, wherein the mark is part of an overlay mark or an alignment mark.

16. The method according to clause 14 or 15, wherein the relation is determined from at least two different thicknesses of the probationary layer and at least two respective extents of height variation across the surface of the probationary layer deposited on the probationary mark in response to the at least two different thicknesses of the probationary layer.

17. The method according to clause 16, wherein the determining the relation comprises fitting a curve using the at least two different determined height variations in response to the at least two different thicknesses of the probationary layer.

18. The method according to clause 17, wherein the curve is a linear curve.

19. The method according to clause 17 or 18, wherein the pre-defined thickness of the process layer exceeds the at least two thicknesses of the probationary layer, the desired depth being determined using an extrapolation of the curve.

20. The method according to any of clauses 17-19, wherein the at least two respective extents of height variation across the surface of the probationary layer deposited on the probationary mark are determined using a process model.

21. The method according to any of clauses 15 to 20, wherein the extent of height variation across the surface of the probationary layer deposited on the probationary mark is determined using a simulation of an alignment system interacting with the height variation across the surface of the probationary layer.

22. The method according to clause 21, wherein the simulation is performed for plural bottom critical dimensions of the probationary trench, the method further comprising selecting the bottom critical dimension of the probationary trench using an outcome of the simulation.

23. An alignment mark designed according to the method of any of clauses 14 to 22.

24. A method of aligning a substrate in a lithographic process, the method comprising:
   providing a substrate comprising an alignment mark in accordance with clause 24, and
   providing the layer on the substrate, and
   performing an alignment measurement on a height variation of the layer across the alignment mark.

25. A computer program containing one or more sequences of machine-readable instructions describing a method according to any of clauses 14 to 24.

26. A data storage medium having the computer program of clause 25 stored therein.

27. A computer system configured to execute the computer program of clause 25.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of designing an alignment mark for on a substrate, the alignment mark comprising at least one trench to be etched into the substrate, the method comprising:
   obtaining a relation between an extent of height variation across a surface of a probationary layer deposited on a probationary mark having a probationary mark trench of a probationary depth, and a thickness of the probationary layer, wherein the probationary mark is representative of the alignment mark and wherein the probationary layer is representative of a process layer to be deposited on the alignment mark;
   determining a desired extent of height variation across the surface of the probationary layer deposited on the probationary mark, the height variation at the desired extent to enable to determine by an alignment system, from the height variation across the surface of the probationary layer on the probationary mark, a position of the probationary mark; and
   configuring, by a hardware computer system, the alignment mark by determining a desired depth of the at least one trench of the alignment mark using the relation, the desired extent of height variation and a pre-defined thickness of the process layer to be deposited on the alignment mark.

2. The method according to claim 1, wherein the relation is determined from at least two different thicknesses of the probationary layer and at least two respective extents of height variation across the surface of the probationary layer deposited on the probationary mark in response to the at least two different thicknesses of the probationary layer.

3. The method according to claim 2, wherein the determining the relation comprises fitting a curve using the at least two different determined height variations in response to the at least two different thicknesses of the probationary layer.

4. The method according to claim 3, wherein the curve is a linear curve.

5. The method according to claim 3, wherein the pre-defined thickness of the process layer exceeds the at least two thicknesses of the probationary layer, the desired depth being determined using an extrapolation of the curve.

6. The method according to claim 2, wherein the at least two respective extents of height variation across the surface of the probationary layer deposited on the probationary mark are determined using a process model.

7. The method according to claim 1, wherein the desired extent of height variation across the surface of the probationary layer deposited on the probationary mark is determined using a simulation of the alignment system interacting with the height variation across the surface of the probationary layer.

8. The method according to claim 7, wherein the simulation is performed for plural critical dimensions at the bottom of the probationary mark trench, and the method further comprising selecting a bottom critical dimension of the probationary mark using an outcome of the simulation.

9. A computer program product comprising a non-transitory computer-readable medium having instructions therein, the instructions, when executed by a computer system, configured to cause the computer system to at least:
   obtain a relation between an extent of height variation across a surface of a probationary layer deposited on a probationary mark having a probationary mark trench of a probationary depth, and a thickness of the probationary layer, wherein the probationary mark is representative of an alignment mark for on a substrate and wherein the probationary layer is representative of a process layer to be deposited on the alignment mark;
   determine a desired extent of height variation across the surface of the probationary layer deposited on the probationary mark, the height variation at the desired extent to enable to determine by an alignment system, from the height variation across the surface of the probationary layer on the probationary mark, a position of the probationary mark; and
   configure the alignment mark by determining a desired depth of the at least one trench of the alignment mark to be etched into the substrate using the relation, the desired extent of height variation and a pre-defined thickness of the process layer to be deposited on the alignment mark.

10. The computer program product according to claim 9, wherein the relation is determined from at least two different thicknesses of the probationary layer and at least two respective extents of height variation across the surface of the probationary layer deposited on the probationary mark in response to the at least two different thicknesses of the probationary layer.

11. The computer program product according to claim 10, wherein the instructions configured to cause the computer system to determine the relation are further configured to cause the computer system to fit a curve using the at least two different determined height variations in response to the at least two different thicknesses of the probationary layer.

12. The computer program product according to claim 11, wherein the curve is a linear curve.

13. The computer program product according to claim 11, wherein the pre-defined thickness of the process layer exceeds the at least two thicknesses of the probationary layer, the desired depth being determined using an extrapolation of the curve.

14. The computer program product according to claim 10, wherein the at least two respective extents of height variation across the surface of the probationary layer deposited on the probationary mark are determined using a process model.

15. The computer program product according to claim 9, wherein the instructions configured to cause the computer system to determine the desired extent of height variation across the surface of the probationary layer deposited on the probationary mark is further configured to cause the computer system to use a simulation of the alignment system interacting with the height variation across the surface of the probationary layer.

16. The computer program product according to claim 15, wherein the simulation is performed for plural critical dimensions at the bottom of the probationary mark trench, and the instructions are further configured to cause the computer system to select a bottom critical dimension of the probationary mark using an outcome of the simulation.

17. A computer program product comprising a non-transitory computer-readable medium having instructions therein, the instructions, when executed by a computer system, configured to cause the computer system to at least:
obtain a relation between an extent of height variation across a surface of a probationary layer deposited on a probationary trench of a probationary depth, and a thickness of the probationary layer;
determine an extent of height variation across a surface of a layer to be deposited on a mark allowing a metrology system to determine a position of the mark; and
configure the mark by determining a depth of a trench of the mark to be etched into a substrate based on the relation, the extent of height variation and the thickness of the layer.

18. The computer program product according to claim 17, wherein the mark is part of an overlay mark.

19. The computer program product according to claim 17, wherein the relation is determined from at least two different thicknesses of the probationary layer and at least two respective extents of height variation across the surface of the probationary layer deposited on the probationary mark in response to the at least two different thicknesses of the probationary layer.

20. The computer program product according to claim 19, wherein the instructions configured to cause the computer system to determine the relation are further configured to cause the computer system to fit a curve using the at least two different determined height variations in response to the at least two different thicknesses of the probationary layer.

21. The computer program product according to claim 17, wherein the instructions configured to cause the computer system to determine the desired extent of height variation across the surface of the probationary layer deposited on the probationary mark is further configured to cause the computer system to use a simulation of the metrology system interacting with the height variation across the surface of the probationary layer.

* * * * *